United States Patent

Hino et al.

[11] Patent Number: 6,036,772
[45] Date of Patent: Mar. 14, 2000

[54] METHOD FOR MAKING SEMICONDUCTOR DEVICE

[75] Inventors: Tomonori Hino; Satoshi Taniguchi; Satoshi Ito, all of Kanagawa, Japan

[73] Assignee: Sony Corporation, Tokyo, Japan

[21] Appl. No.: 08/999,446

[22] Filed: Dec. 29, 1997

[30] Foreign Application Priority Data

Dec. 30, 1996 [JP] Japan ................................ 8-358288

[51] Int. Cl.$^7$ ................................................ C30B 25/18
[52] U.S. Cl. ........................... 117/95; 117/106; 117/107; 117/955; 117/956; 438/35; 438/37; 438/506; 438/522; 438/796; 438/925; 438/944
[58] Field of Search ............................... 438/35, 37, 925, 438/944, 506, 522, 796; 117/95, 106, 107, 955, 956

[56] References Cited

U.S. PATENT DOCUMENTS

| | | | |
|---|---|---|---|
| 5,063,166 | 11/1991 | Mooney et al. | 437/22 |
| 5,372,970 | 12/1994 | Kubo | 437/133 |
| 5,597,740 | 1/1997 | Ito et al. | 437/23 |
| 5,705,831 | 1/1998 | Uemora et al. | 257/78 |
| 5,707,900 | 1/1998 | Sano et al. | 438/509 |
| 5,732,099 | 3/1998 | Kawasumi et al. | 372/48 |

FOREIGN PATENT DOCUMENTS 6-175178  2/1996  Japan.

*Primary Examiner*—Robert Kunemund
*Attorney, Agent, or Firm*—Hill & Simpson

[57] ABSTRACT

A method for making a semiconductor device comprises: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing the Group II–VI compound semiconductor layer, a particle beam composed of at least one Group II element selected from the group consisting of zinc, magnesium, beryllium, cadmium and mercury is radiated onto the Group III–V compound semiconductor layer in a dose of $8 \times 10^{-4}$ Torr·sec or more.

19 Claims, 11 Drawing Sheets

RATIO (tZn / t4) OF Zn IRRADIATION TIME (tZn)
TO THE TIME (t4) THAT THE QUADRUPLET PATTERN
IN THE <110> DIRECTION DISAPPEARS

METHOD FOR MAKING SEMICONDUCTOR DEVICE

BACKGROUND OF THE INVENTION

1. Field of the Invention

The present invention relates to a method for making a semiconductor device in which a Group II–VI compound semiconductor layer is deposited onto a Group III–V compound semiconductor layer.

2. Description of the Related Art

High-density or high-resolution recording/reproducing has been required for optical recording disks and magnetooptical recording disks, and compound semiconductors emitting green or blue light have been intensively studied for achieving such a requirement.

Among them, a Group II–VI compound semiconductor having feasible prospects is composed of at least one Group II element, i.e., zinc, magnesium, manganese, beryllium, cadmium and mercury and at least one Group VI element, i.e., oxygen, sulfur, selenium and tellurium. Particularly, a ZnMgSSe mixed crystal is easily deposited on a GaAs mixed crystal substrate, and is suitable for the formation of guide layers and/or clad layers in the production of semiconductor devices, such as blue-light semiconductor laser devices (for example, refer to Electron. Lett., 28, p. 1798 (1992); Electron. Lett., 29, p. 1488(1993); and Appl. Phys. Lett., 66, p. 656(1995)). Luminescent Group II–VI compound semiconductor devices have been produced by depositing a Group II–VI compound semiconductor layer onto a compound semiconductor substrate composed of Group III–V elements, such as GaAs, by molecular beam epitaxy.

A conventional luminescent Group II–VI semiconductor device, however, has many stacking faults which are originated near the interface between the Group III–V compound semiconductor layer and the Group II–VI compound semiconductor layer. The partial dislocation at the edge of the stacking fault region is degraded in the active layer by introducing a current flow, and that causes increased non-luminescent recombination centers in the active layer. The luminescent efficiency of the luminescent semiconductor device decreases with time, and thus the life of the device is restricted (refer to Guha et al., Appl. Phys. Lett., 63, p. 3107 (1993)). Consequently, the decrease in the stacking fault density in the Group II–VI compound semiconductor layer is essential for the achievement of an extended life of the device.

Although the reduction of the stacking fault density has been intensively studied in various institutes, the stacking fault density which has been reported is generally $5 \times 10^3$ cm$^{-2}$ or more at best, and no technology for consistently reducing the stacking fault density to $5 \times 10^3$ cm$^{-2}$ or less has been established (refer to L. H. Kuo et al., Appl. Phys. Lett., 69, p. 1408(1996); and Preprint of 43rd spring meeting, The Japan Society of Applied Physics and Related Societies, p. 27-ZD-1,2,3,4,5 spring in 1996).

SUMMARY OF THE INVENTION

It is an object of the present invention to provide a method for making a semiconductor device, which permits a decreased stacking fault density and a prolonged life of the device.

A first aspect of the present invention is a method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing the Group II–VI compound semiconductor layer, a particle beam composed of at least one Group II element selected from the group consisting of zinc, magnesium, beryllium, cadmium and mercury is radiated onto the Group III–V compound semiconductor layer in a dose of $8 \times 10^{-4}$ Torr·sec or more.

In this method, a particle beam of at least one Group II element selected from the group consisting of zinc, magnesium manganese, beryllium, cadmium and mercury is radiated on a Group III–V compound semiconductor layer. The dose of the particle beam is $8 \times 10^{-4}$ Torr·sec or more. A Group II–VI semiconductor layer is deposited thereon.

The second aspect of the present invention is a method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing the Group II–VI compound semiconductor layer, a particle beam composed of at least one Group II element selected from the group consisting of zinc, magnesium, beryllium, cadmium and mercury is radiated onto the Group III–V compound semiconductor layer in a dose, as the number which reaches the depositing surface, of $3.5 \times 10^{17}$ cm$^{-2}$ or more.

In this method, a particle beam of at least one Group II element selected from the group consisting of zinc, magnesium manganese, beryllium, cadmium and mercury is radiated on a Group III–V compound semiconductor layer. The dose of the particle beam reaching the depositing surface is $3.5 \times 10^f$ cm$^{-2}$ or more. A Group II–VI semiconductor layer is deposited thereon.

A third aspect of the present invention is a method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing the Group II–VI compound semiconductor layer, the surface of the Group III–V compound semiconductor is rearranged to a (2×4) stabilized-arsenic surface observed by RHEED, and then a particle beam composed of at least one Group II element selected from the group consisting of zinc, magnesium, beryllium, cadmium and mercury is radiated onto the surface of the Group III–V compound semiconductor layer for a multiplet structure in the <110> direction on the surface observed by RHEED to change from a quadruplet pattern (4×) to a singlet pattern (1×).

In this method, the surface of the Group III–V compound semiconductor layer is changed to a (2×4) stabilized-arsenic surface according to RHEED observation by controlling the temperature. Next, a particle beam of at least one Group II element selected from the group consisting of zinc, magnesium manganese, beryllium, cadmium and mercury is radiated thereon for a multiplet structure in the <110> direction on the surface observed by RHEED to change from a quadruplet pattern (4×) to a singlet pattern (1×). A Group II–VI semiconductor layer is deposited thereon.

A fourth aspect of the present invention is a method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing the Group II–VI compound semiconductor layer, the surface of the III–V compound semiconductor is rearranged to a (2×2) stabilized-phosphorus surface or a (2×4) stabilized-phosphorus surface observed by RHEED, and then a particle beam composed of at least one Group II element selected from the group consisting of zinc, magnesium, beryllium, cadmium and mercury is radiated onto the surface of the Group III–V compound semiconductor layer for a multiplet structure in the <110> direction on the surface observed by RHEED to change from a doublet pattern (2×) or a quadruplet pattern (4×) to a singlet pattern (1×).

In this method, the surface of the Group III–V compound semiconductor layer is changed to a (2×2) stabilized-phosphorus surface or a (2×4) stabilized-phosphorus surface according to RHEED observation by controlling the temperature. Next, a particle beam of at least one Group II element selected from the group consisting of zinc, magnesium manganese, beryllium, cadmium and mercury is radiated thereon for a multiplet structure in the <110> direction on the surface observed by RHEED to change from a quadruplet pattern (4×) or a doublet pattern (2×) to a singlet pattern (1×). A Group II–VI semiconductor layer is deposited thereon.

DESCRIPTION OF THE PREFERRED EMBODIMENTS

Figure 1:
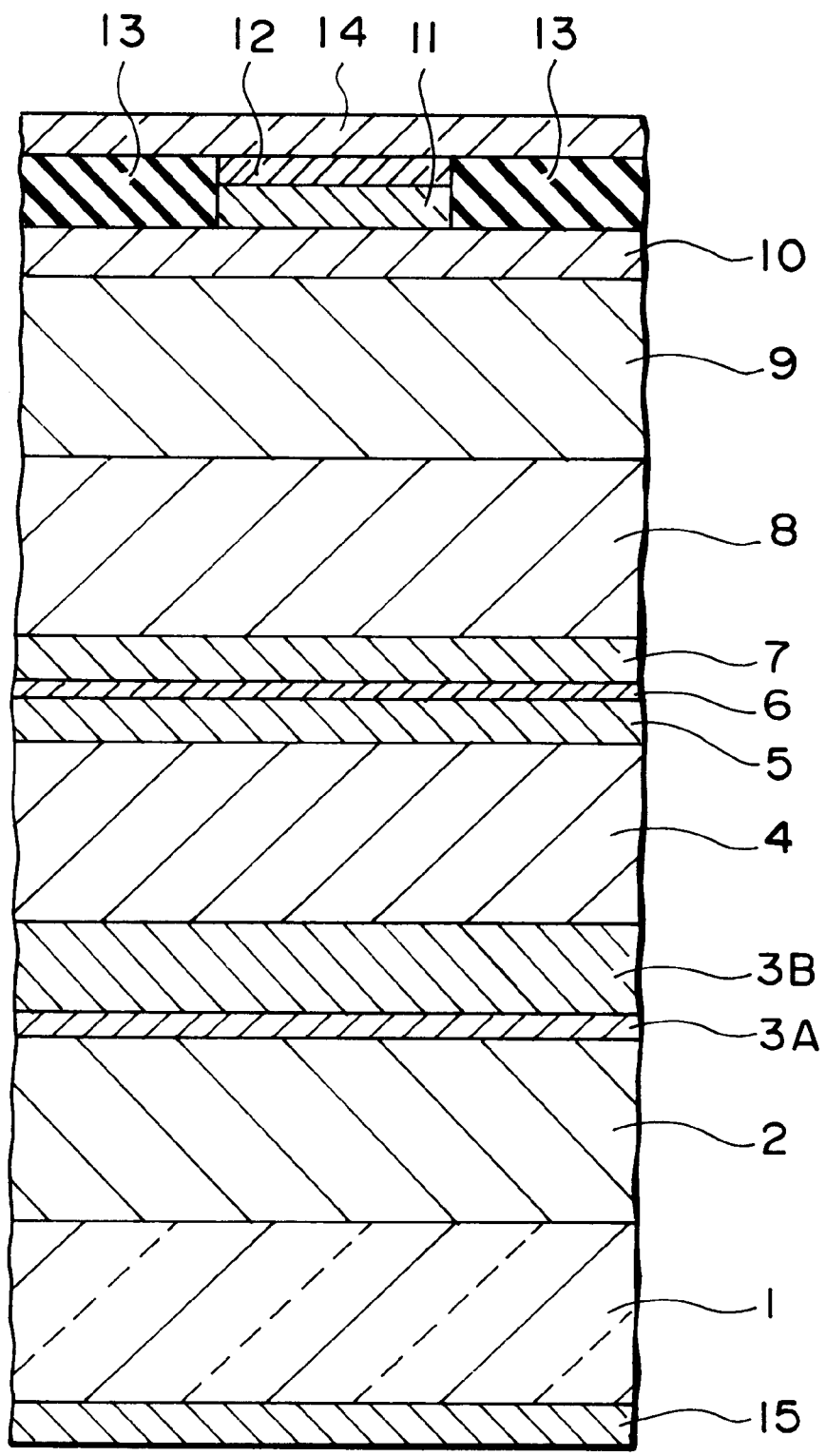
FIG. 1 is a cross-sectional view of a luminescent semiconductor device fabricated by a method in accordance with an embodiment of the present invention.

The embodiments of the present invention will now be described in detail with reference to the attached drawings. The following embodiments include a method for making a luminescent semiconductor device shown in FIG. 1, in which a Group III–V buffer layer 2 composed of a Group III–V compound semiconductor is deposited on a substrate 1, and then a first Group II–VI buffer layer 3A composed of a Group II–VI compound semiconductor, a second Group II–VI buffer layer 3B, a first clad layer 4, a first guide layer 5, an active layer 6, a second guide layer 7, a second clad layer 8, a first semiconductor layer 9, a second semiconductor layer 10, a superlattice semiconductor layer 11 and a contact layer 12 are deposited in that order.

Figure 2:
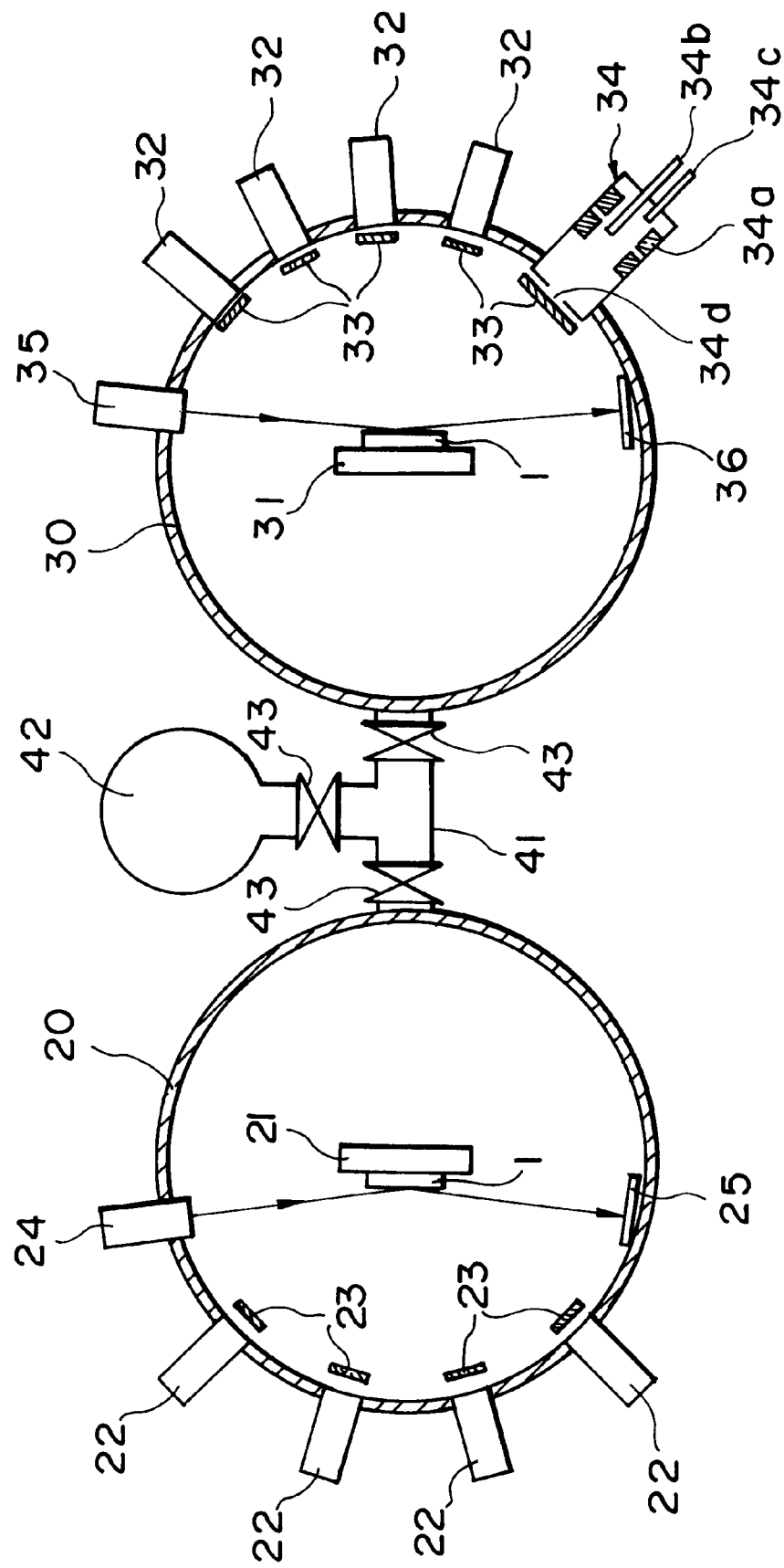
FIG. 2 is a cross-sectional schematic view of a MBE epitaxy apparatus used in the method for making the luminescent semiconductor device in accordance with the present invention.

FIG. 2 is a cross-sectional schematic view of a MBE epitaxy apparatus used in the method for making the luminescent semiconductor device in accordance with the present invention. The MBE epitaxy apparatus belongs to vacuum deposition systems, and is provided with two deposition chambers 20 and 30 connected to ultra-high vacuum evacuating systems not shown in the drawing. These deposition chambers 20 and 30 are linked to a vacuum transfer chamber 41 and a substrate introducing chamber 42 with three gate valves 43 provided therebetween. These gate valves 43 prevent the contamination on the substrate surface by the remnant molecular beams (particle beams) from these deposition chambers during the transfer of the substrate, and maintains a high vacuum in the transfer chamber.

The deposition chamber 20 is used for depositing the Group III–V compound semiconductor layer and is provided with a substrate holder 21 for holding the substrate 1 therein. The substrate holder 21 can be heated with a heater not shown in the drawing. The deposition chamber 20 is also provided with a plurality of particle beam source cells 22, for example, Knudsen cells or K cells, such that these cells face the substrate 1. Each of these particle beam source cells 22 is filled with one of a Group III element such as gallium or aluminum, a Group V element such as arsenic or phosphorus, and an n-type impurity or dopant such as silicon. Each particle beam source cell 22 is provided with a shutter 23 near the radiation port. The shutter 23 is opened or closed by a control unit not shown in the drawing. Further, the deposition chamber 20 is provided with a combination of a high-speed electron gun 24 with a screen 25. Accelerated electron beams are emitted from the high-speed electron gun 24 towards the substrate 1 with a low angle, for example 1°, and reflected from the surface of the substrate 1 towards the screen 25, and a reflection high energy electron diffraction (RHEED) image is shown on the screen 25 to observe the surface of the substrate 1. In this embodiment, the screen 25 employed permits the observation of the rearrangement structure on the surface.

The deposition chamber 30 is used for depositing the Group II–VI compound semiconductor layers, and is provided with a substrate holder 31 and a plurality of particle beam source cells 32 therein, as in the deposition chamber 20. Each of these particle beam source cells 32 is filled with one of a Group II element, e.g. zinc, magnesium, cadmium, mercury or beryllium, a Group VI element, e.g. selenium, zinc sulfide or tellurium, and an n-type impurity or dopant, e.g. zinc oxide. Each particle beam source cell 32 is also provided with a shutter 33 near the radiation port. Further, the deposition chamber is provided with a plasma generating chamber 34 which generates nitrogen plasma and radiates it to the substrate for doping nitrogen as a p-type impurity or dopant. The plasma generating chamber 34 is composed of, for example, an electron cyclotron resonance (ECR) cell. Microwaves are supplied into the cell surrounded with magnets 34a through a microwave terminal 34b, while nitrogen plasma is generated in the cell from gaseous nitrogen supplied through the gas inlet tube 34c and radiated from the plasma outlet port 34d. A shutter 33 is provided near the plasma outlet port 34d connected to a control unit not shown in the drawing. The plasma generating chamber 34 may be composed of a radio frequency (RF) cell. Further, the deposition chamber 30 is provided with a combination of a high-speed electron gun 35 and a screen 36. Accelerated electron beams are emitted from the high-speed electron gun 35 towards the substrate 1, and reflected on the surface of the substrate 1 towards the screen 36, and a RHEED image is shown on the screen 36 to observe the surface of the substrate 1. In this embodiment, the screen 25 employed permits the observation of the rearrangement structure on the surface.

Using the above-mentioned MBE epitaxy apparatus, a n-GaAs substrate 1 doped with silicon as a n-type impurity, having a thickness of 350 mn, is fixed onto the substrate holder 21 in the deposition chamber 20 and heated to approximately 580° C. to remove the oxide film on the substrate surface. Relevant particle beams are supplied to deposit a Group III–V buffer layer 2 composed of silicon-doped n-GaAs by a thickness of at least 10 nm, and preferably at least 200 nm. The formation of the Group III–V buffer layer 2 results in the planarization of the surface of the substrate 1 and thus a decreased stacking fault density in a Group II–VI compound semiconductor layer which is deposited thereon. The stacking faults form near the interface between a Group III–V compound semiconductor layer and a Group II–VI compound semiconductor layer, that is, the interface between the Group III–V buffer layer 2 and the first Group II–VI buffer layer 3A, and it is significantly important to reduce the stacking fault density in the first Group II–VI buffer layer 3A.

After the deposition of the Group III–V buffer layer 2, for example, the substrate 1 is maintained at 400° C. in an arsenic atmosphere or while being irradiated with an arsenic particle beam. According to RHEED observation, the surface of the Group III–V buffer layer 2 is rearranged into a c(4×4) excessive-arsenic surface. Next, the substrate is transferred to the deposition chamber 30 via the vacuum transfer chamber 41. The c(4×4) excessive-arsenic surface prevents adhesion of impurities, and forms a surface suitable for the deposition of the Group II–VI compound semiconductor layer by eliminating the excessive arsenic on the surface. It is preferable that the vacuum transfer chamber 41 and the substrate introducing chamber 42 be maintained at $1 \times 10^{-9}$ Torr or less.

The substrate 1 is fixed on the substrate holder 31 in the deposition chamber 30. Before depositing the Group II–VI compound semiconductor layer, the substrate 1 is heated to a temperature of, for example, 460° C. or more, which causes the rearrangement from the c(4×4) excessive-arsenic surface to a (2×4) stabilized-arsenic surface on the Group III–V buffer layer 2 according to RHEED observation. The substrate 1 is cooled to a temperature, for example 280° C., for depositing the Group II–VI compound semiconductor layer.

Figure 3:
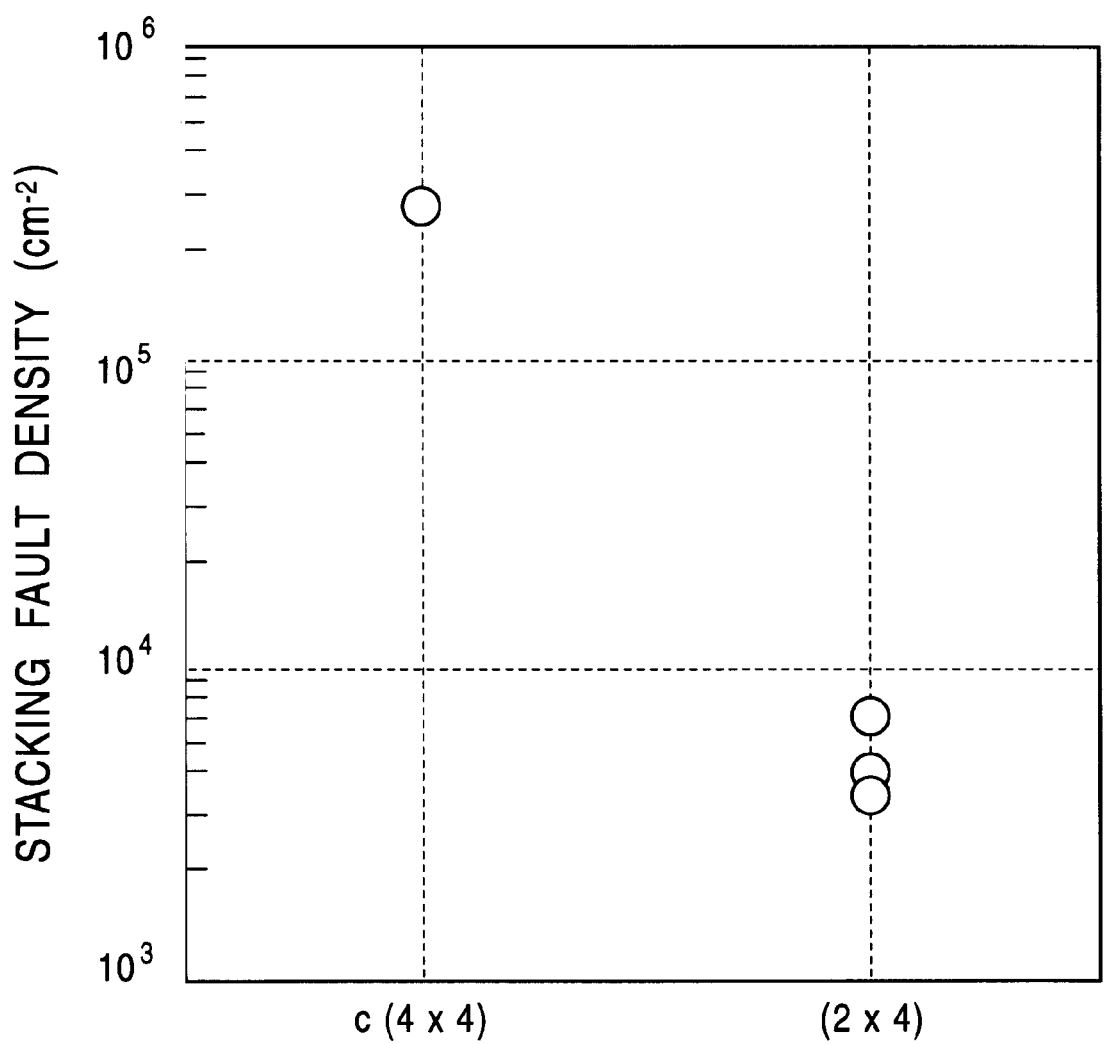
FIG. 3 is a graph illustrating the correlation between the rearranged surface structure and the stacking fault density in a Group II–VI buffer layer.

According to RHEED observation, the (2×4) stabilized-arsenic surface on the Group III–V buffer layer 2 more effectively contributes to the reduction of the stacking fault density than the c(4×4) excessive-arsenic surface. FIG. 3 is a graph for the comparison of the stacking fault density in the Group II–VI compound semiconductor layer deposited on the c(4×4) excessive-arsenic surface with that on the (2×4) stabilized-arsenic surface. FIG. 3 demonstrates that the (2×4) stabilized-arsenic surface results in the effective reduction of the stacking fault density in the Group II–VI compound semiconductor layer.

In this embodiment, the rearrangement to the (2×4) stabilized-arsenic surface is performed in the deposition chamber 30. Alternatively, before transferring the substrate 1 into the deposition chamber 30, the substrate 1 may be placed into the substrate introducing chamber 42, and may be heated to a temperature of, for example, 460° C. or more, which causes the rearrangement from the c(4×4) excessive-arsenic surface to a (2×4) stabilized-arsenic surface on the Group III–V buffer layer 2.

After the rearrangement to the (2×4) stabilized-arsenic surface, while the substrate 1 is maintained at the above-mentioned temperature, for example, 280° C., a zinc beam as the Group II element beam is radiated onto the substrate 1 in a dose of at least $8 \times 10^{-4}$ Torr/sec, preferably at least $8.5 \times 10^{-4}$ Torr/sec, and more preferably at least $1 \times 10^{-3}$ Torr/sec. The dose means the product P×t (Torr·sec) of the particle beam intensity P (Torr) by the irradiation time t (sec). The particle beam intensity P during the irradiation is, for example, $1.6 \times 10^{-6}$ Torr, and the irradiation time t is 9 minutes or more.

Figure 4:
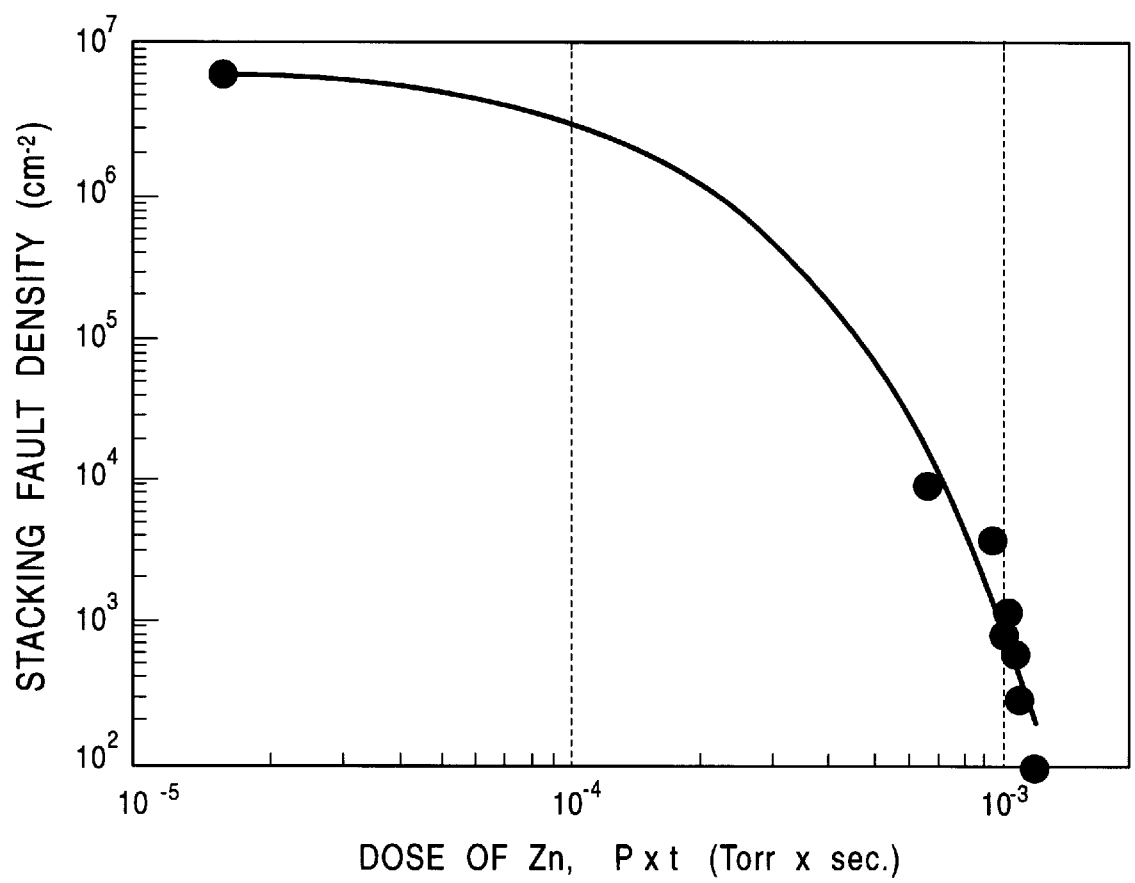
FIG. 4 is a graph illustrating the correlation between the dose of zinc particles which is represented by the product of the intensity P by the radiation time and the stacking fault density.

The dose is also represented with the number of the zinc particles which reach the deposition surface. The above-mentioned dose is equivalent to at least $3.5 \times 10^{17}$ cm$^{-2}$, preferably at least $4.0 \times 10^{17}$ cm$^{-2}$, and more preferably at least $4.5 \times 10^{17}$ cm$^{-2}$. The number of zinc particles corresponds to the product f×t (cm$^{-2}$) of the number f (cm$^{-2}$·sec$^{-1}$) of particles which reach the deposition surface per unit time and unit area by the irradiation time (sec). For example, the deposition surface is irradiated by $7.09 \times 10^{14}$ cm$^{-2}$sec$^{-1}$ particles for at least 9 minutes. FIG. 4 is a graph illustrating the correlation between the dose P×t of zinc particles and the stacking fault density in the Group II–VI compound semiconductor layer. As shown in FIG. 4, the stacking fault density is reduced to $5 \times 10^3$ cm$^{-2}$ or less for a dose P×t of $8 \times 10^{-4}$ Torr·sec or more, $3 \times 10^3$ cm$^{-2}$ or less for a dose P×t of $8.5 \times 10^{-4}$ Torr·sec or more, or $4 \times 10^3$ cm$^{-2}$ or less for a dose P×t of $1 \times 10^{-3}$ Torr·sec or more.

Figure 5:
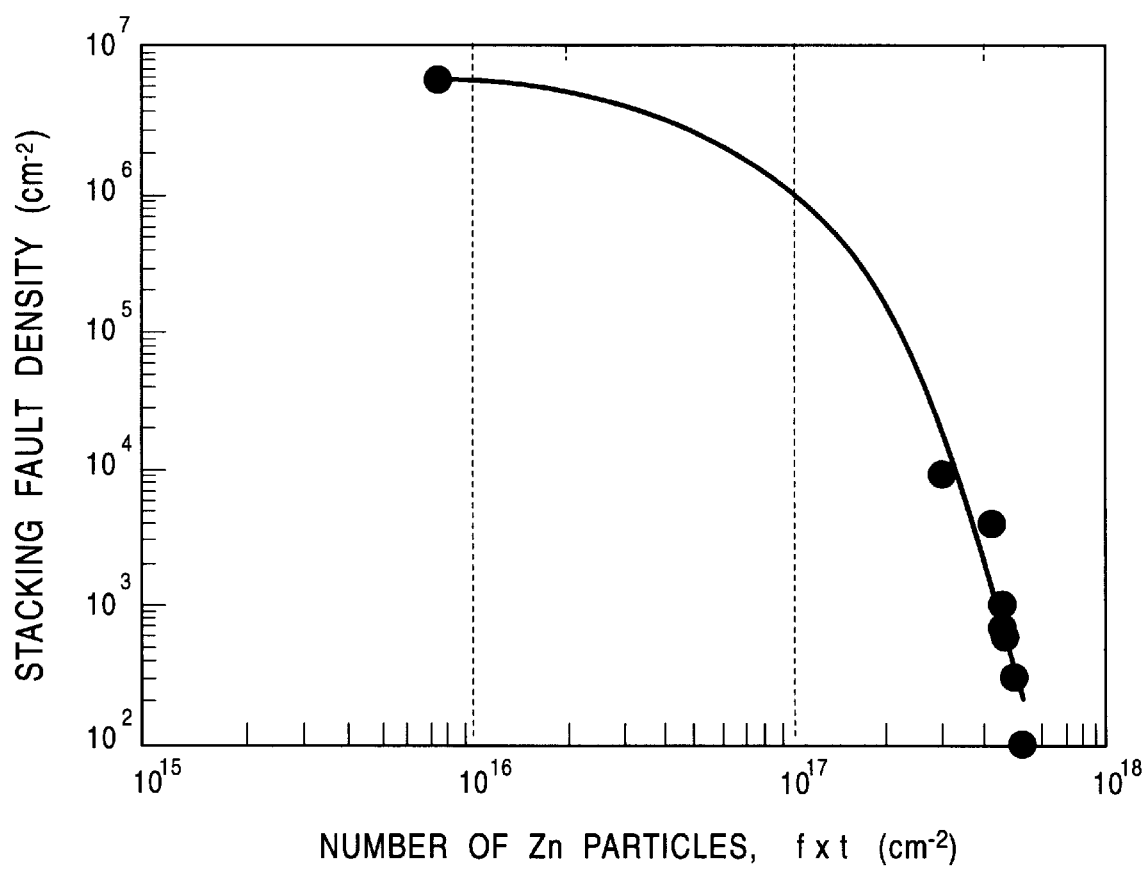
FIG. 5 is a graph illustrating the correlation between the dose represented by the product of the number f (cm$^{-2}$·sec$^{-1}$) of zinc particles by the radiating time per unit time and unit area and the stacking fault density.

FIG. 5 is a graph illustrating the correlation between the number f×t of zinc particles and the stacking fault density in the Group II–VI compound semiconductor layer. As shown in FIG. 5, the stacking fault density is reduced to $5 \times 10^3$ cm$^{-2}$ or less for a number f×t of $3.5 \times 10^{17}$ cm$^{-2}$ or more, $3 \times 10^3$ cm$^{-2}$ or less for a number f×t of $4.0 \times 10^{17}$ cm$^{-2}$ or more, or $4 \times 10^2$ cm$^{-2}$ or less for a number f×t of $4.5 \times 10^{17}$ cm$^{-2}$ or more.

Figure 6:
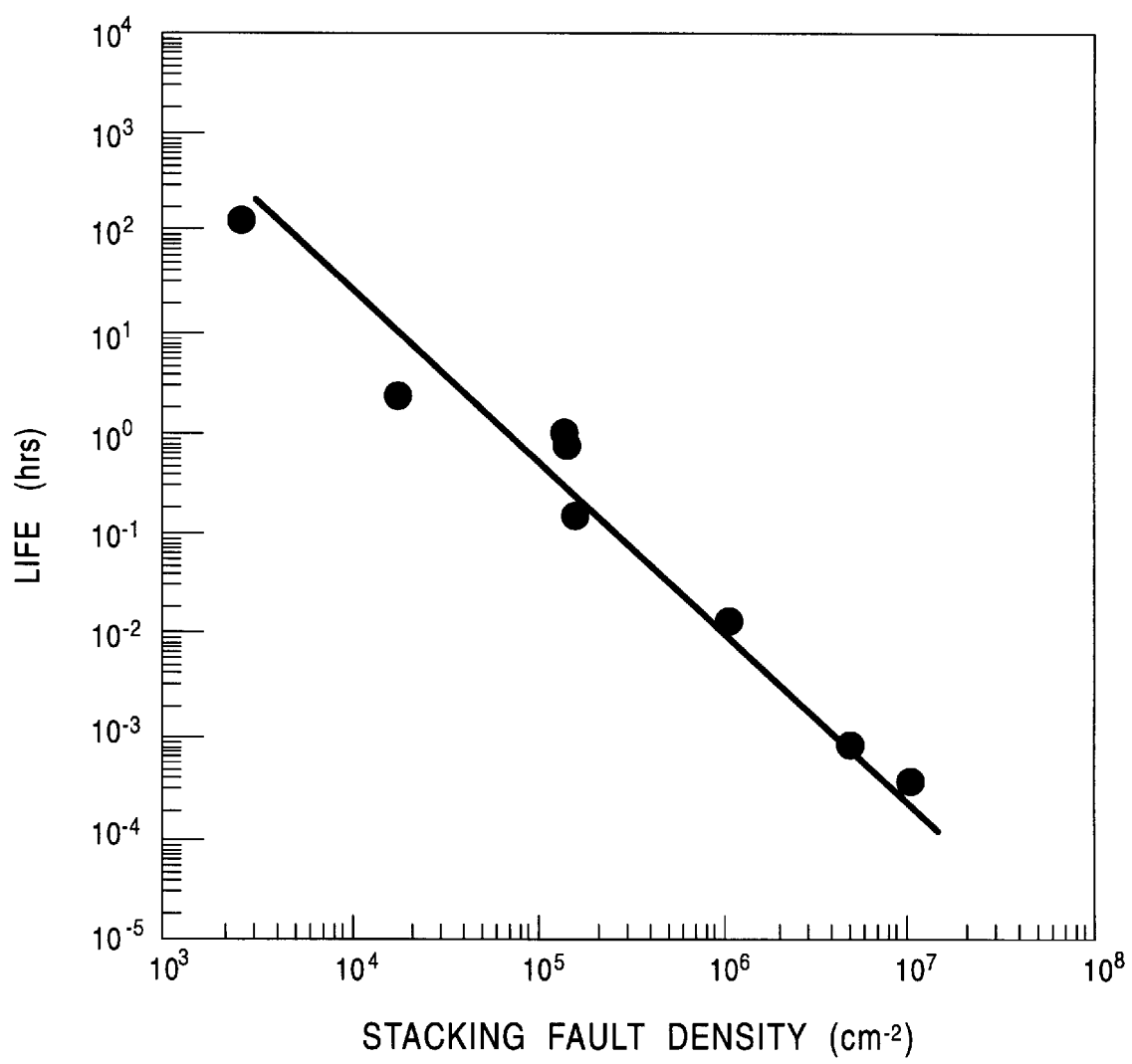
FIG. 6 is a graph illustrating the correlation between the stacking fault density and the life of a luminescent semiconductor device.

When the stacking fault density is $5 \times 10^3$ cm$^{-2}$ or less, the effect of these stacking faults on the substrate is satisfactorily reduced. When the stacking fault density is $3 \times 10^3$ cm$^{-2}$ or less, the effect of the stacking faults is further reduced. When the stacking fault density is $4 \times 10^2$ cm$^{-2}$ or less, the device is not substantially affected by the stacking faults. FIG. 6 is a graph illustrating the correlation between the stacking fault density and the life of the luminescent semiconductor device, referred to by S. Taniguchi, T. Hino, S. Itoh, K. Nakano, A. Ishibishi and M. Ikeda; Electronics Letters 32, pp. 522–553(1996). FIG. 6 suggests that the life of the luminescent semiconductor device will be prolonged to at least 100 hours when the stacking fault density is reduced to $5 \times 10^3$ cm$^{-2}$ or less.

Figure 7:
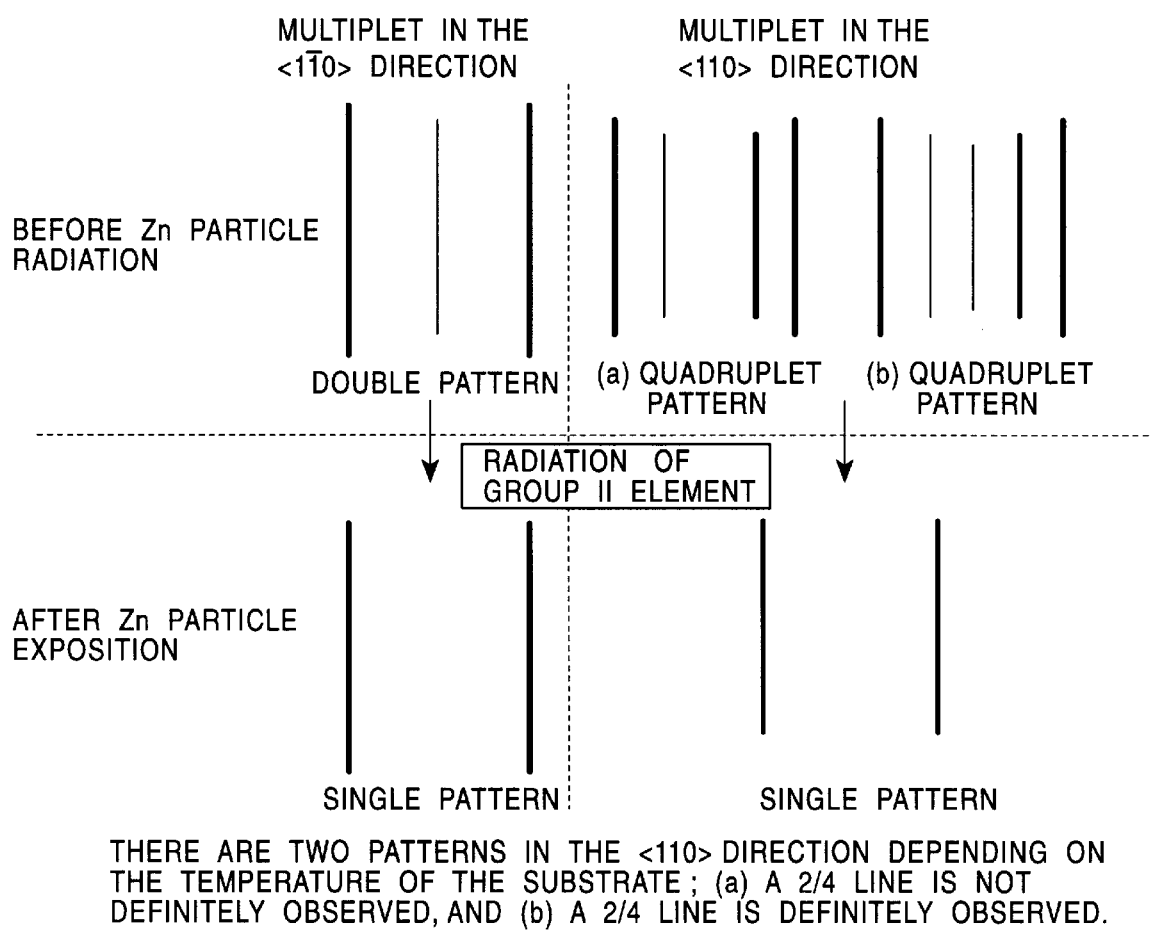
FIG. 7 is a schematic view of multiplet structures in the <110> direction and the <110> direction observed by RHEED.
Figure 8:
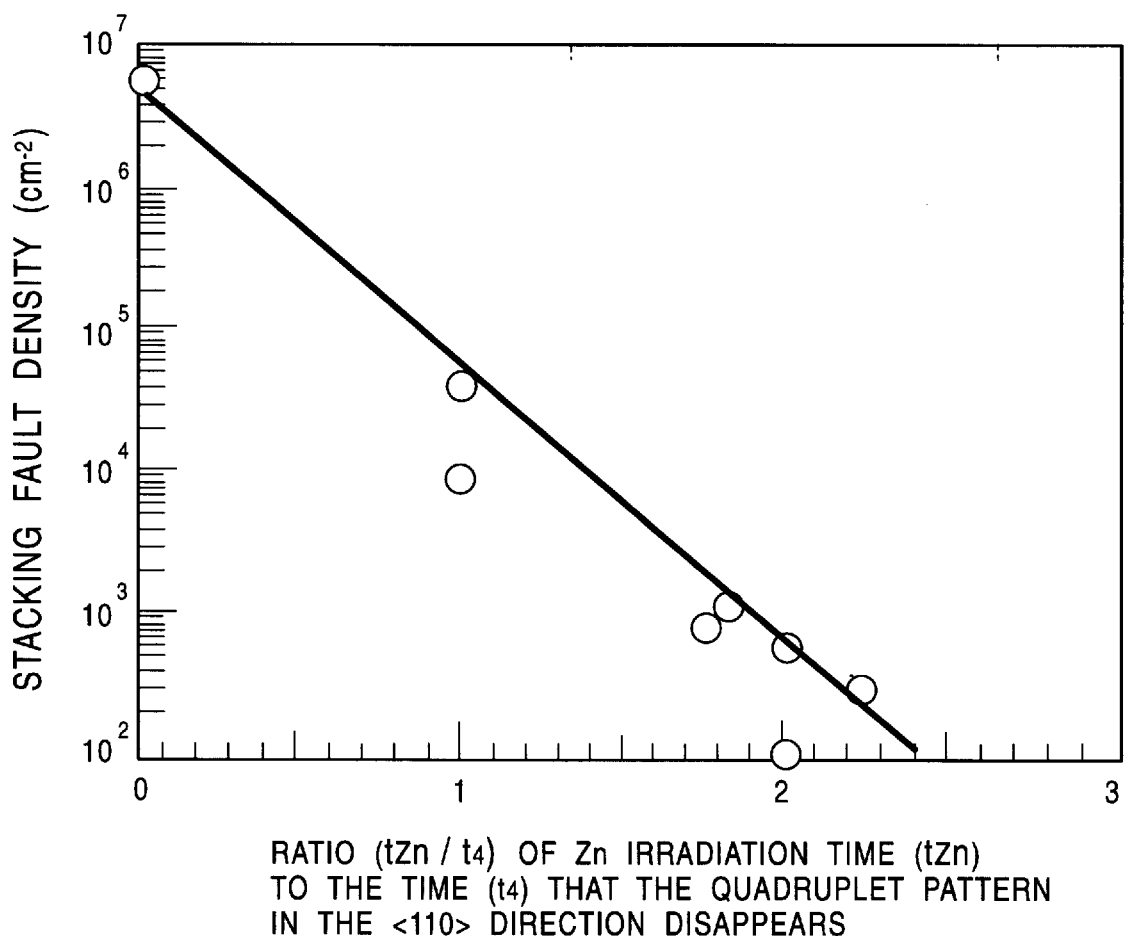
FIG. 8 is a graph illustrating the correlation between the ratio of the irradiation time of zinc particles to the time for the multiplet structure in the <110> direction to change from a quadruplet (4×) pattern to a singlet pattern (1×) according to RHEED observation, and the stacking fault density.

When a zinc particle beam with a dose of at least $8 \times 10^{-4}$ Torr·sec or at least $3.5 \times 10^{17}$ cm$^{-2}$ is radiated, the rearrangement of the surface structure of the Group III–V buffer layer 2 is observed by RHEED as shown in FIG. 7. That is, the multiplet structure in the <110> direction, which is observed by electron beam radiation, changes from a quadruplet pattern (4× in the drawing) to a singlet pattern (1× in the drawing). Also, the multiplet structure in the <110> direction changes from a doublet pattern (2× in the drawing) to a singlet pattern. FIG. 8 is a graph illustrating the correlation between the ratio of the irradiation time of zinc particles to the time for the multiplet structure in the <110> direction to change from a quadruplet pattern to a singlet pattern, and the stacking fault density in the Group II–VI compound semiconductor layer. As shown in FIG. 8, the stacking fault density is reduced to $5 \times 10^3$ cm$^{-2}$ or less when the irradiation time of zinc particles is at least 1.5 times the time for the multiplet structure in the <110> direction to change from a quadruplet pattern to a singlet pattern, to $3 \times 10^3$ cm$^{-2}$ or less when the irradiation time is at least 1.6 times, or to $4 \times 10^2$ cm$^{-2}$ or less when the irradiation time is at least 2.1 times.

In the above description, the irradiation time is changed whereas the dose rate of the zinc particle beam is not changed. FIG. 8 therefore suggests that the stacking fault density is reduced to $5 \times 10^3$ cm$^{-2}$ or less when the dose of the zinc particle beam is at least 1.5 times the dose for the multiplet structure in the <110> direction to change from a quadruplet pattern to a singlet pattern. Accordingly, the dose of the zinc particle beam is represented by the product P×t (Torr·sec) of the intensity P (Torr) of the particle beam by the irradiation time t (sec), or the product f×t (cm$^{-2}$) of the number f (cm$^{-2}$·sec$^{-2}$) of particles exposed on the deposition surface per unit time and unit area by the irradiation time t (sec). Further, the ratio of the dose or the irradiation time to that for the multiplet structure in the <110> direction to change from the quadruplet pattern to the singlet pattern is a parameter which determines the stacking fault density.

After the zinc particle beam with a given dose is radiated, relevant particle beams are supplied onto the Group III–V buffer layer 2 to deposit Group II–VI compound semiconductor layers. First, a first Group II–VI buffer layer 3A having a thickness of 20 nm and composed of n-ZnSe containing chlorine as a n-type impurity is deposited, wherein the concentration of the impurity is, for example, $10 \times 10^{18}$ cm$^{-3}$.

A particle beam composed of zinc as the Group II element and a particle beam composed of selenium as the Group VI element are alternately radiated each at least one time so as to deposit a portion, adjoining the Group III–V buffer layer 2, of the first Group II–VI buffer layer 3A. That is, first the zinc particle beam and the selenium particle beam are alternately radiated each at least one time so as to deposit a portion of the first Group II–VI buffer layer 3A on the Group III–V buffer layer 2, and then both the particle beams are simultaneously radiated to deposit the residual portion of the first Group II–VI buffer layer. By such alternating irradiation, the interface between the Group III–V buffer layer 2 and the first Group II–VI buffer layer is highly planarized, resulting in the reduced stacking fault density.

Instead of the alternating irradiation of the zinc particle beam and the selenium particle beam, the selenium particle beam may be intermittently radiated at least one time while radiating the zinc particle beam to deposit a portion, adjoining the Group III–V buffer layer 2, of the first Group II–VI buffer layer 3A. After such intermittent radiation, the residual portion of the first Group II–VI buffer layer is deposited by the simultaneous irradiation of both the particle beams as in the above-mentioned alternating irradiation.

In the deposition of the first Group II–VI buffer layer 3A, the ratio of the particle beams by intensity P (Torr) of the selenium particle beam to that of the zinc particle beam is preferably 0.91 or more and 1.39 or less, more preferably 0.92 or more and 1.35 or less, and most preferably 0.95 or more and 1.20 or less. The ratio of the particle beams reaching the depositing surface per unit time and unit area is preferably 0.64 or more and 0.98 or less, more preferably 0.65 or more and 0.96 or less, and most preferably 0.67 or more and 0.85 or less.

Figure 9:
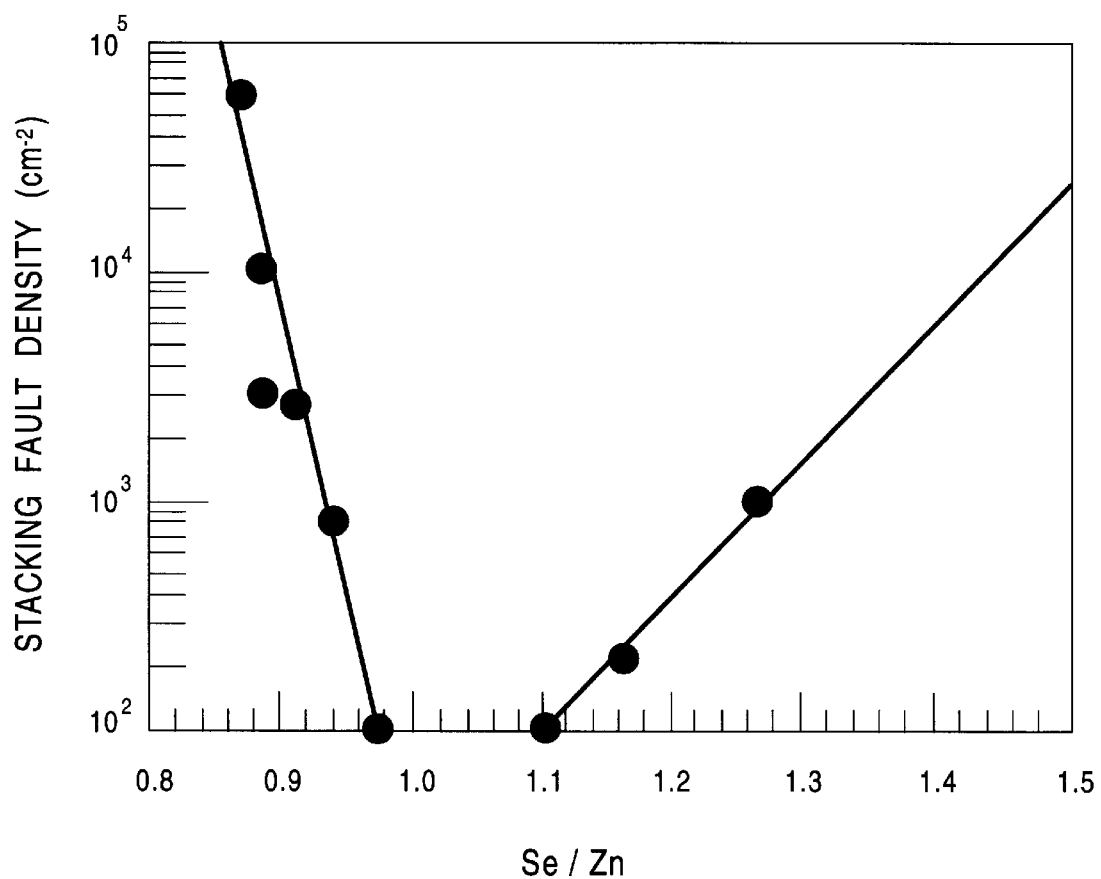
FIG. 9 is a graph illustrating the correlation between the dose ratio by intensity P of the particle beam of selenium to the particle beam of zinc and the stacking fault density.
Figure 10:
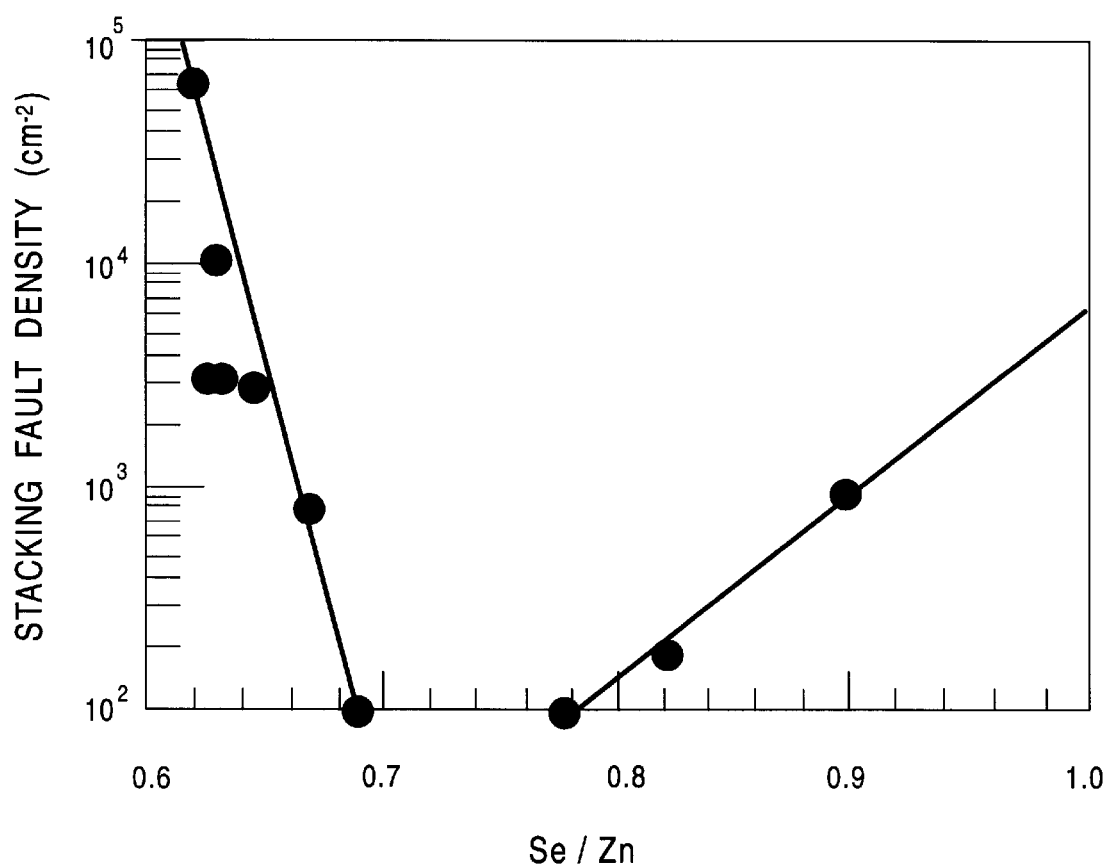
FIG. 10 is a graph illustrating the correlation between the ratio of the particle beam of selenium to the particle beam of zinc reaching the deposited surface and the stacking fault density.

FIGS. 9 and 10 are graphs illustrating the correlation between the ratio of particle beams (Se/Zn) of the selenium particle beam to the zinc particle beam and the stacking fault density in the Group II–VI compound semiconductor layer. Each dose is calculated by the particle beam intensity P (Torr) in FIG. 9, and by the number f (cm$^{-2}$·sec$^{-1}$) of particles reaching the depositing surface per unit time and unit area. FIG. 9 demonstrates that the stacking fault density is reduced to $5 \times 10^3$ cm$^{-2}$ or less when the ratio by the particle beam intensity P (Torr) is 0.91 or more and 1.39 or less, to $3 \times 10^3$ cm$^{-2}$ or less when the ratio is 0.92 or more and 1.35 or less, or to $4 \times 10^2$ cm$^{-2}$ or less when the ratio is 0.95 or more and 1.20 or less. Alternatively, FIG. 10 demonstrates that the stacking fault density is reduced to $5 \times 10^3$ cm$^{-2}$ or less when the ratio by the number f (cm$^{-2}$·sec$^{-1}$) of particles per unit time and unit area reaching the depositing surface is 0.64 or more and 0.98 or less, to $3 \times 10^3$ cm$^{-2}$ or less when the ratio is 0.65 or more and 0.96 or less, or to $4 \times 10^2$ cm$^{-2}$ or less when the ratio is 0.67 or more and 0.85 or less.

Figure 11:
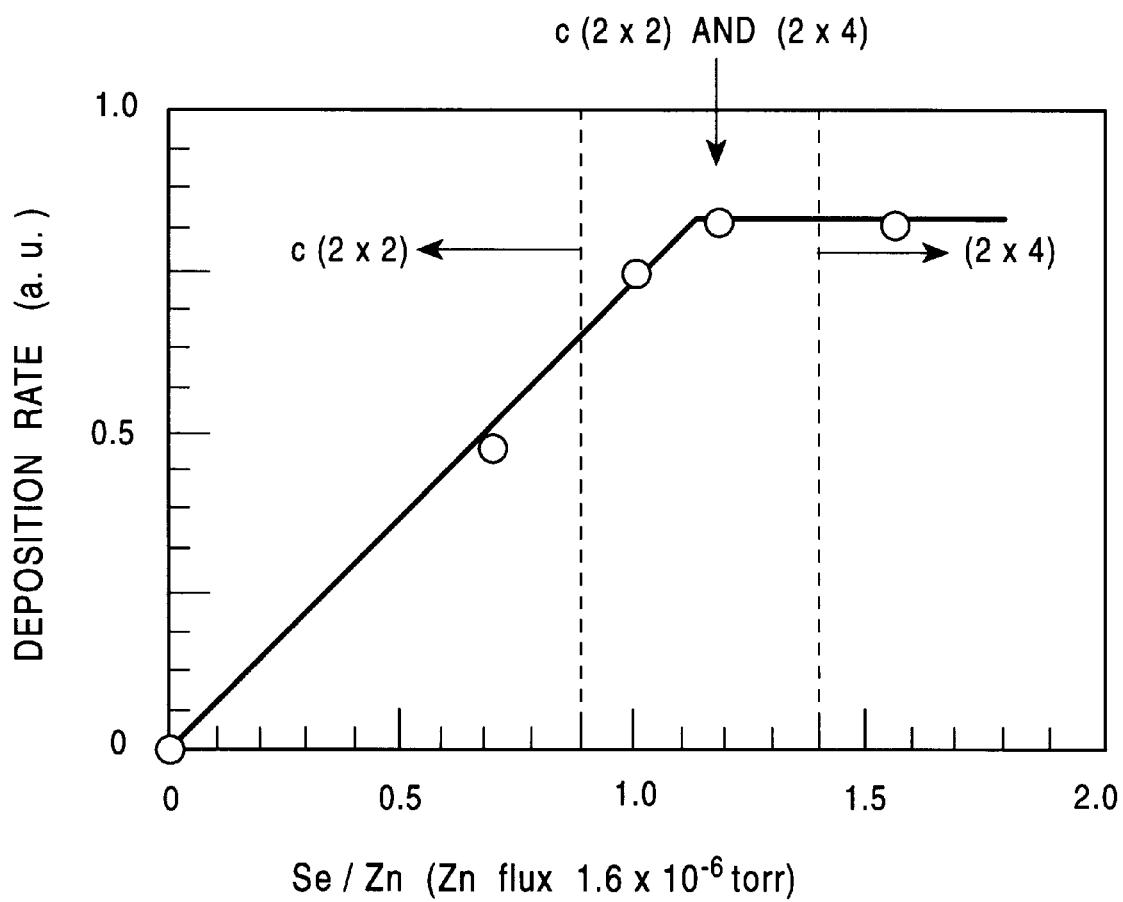
FIG. 11 is a graph illustrating the correlation between the ratio of the particle beam of selenium to the particle beam of zinc and the deposition speed of the ZnSe.

The particle beam intensity P (Torr) is changed by the position of the particle beam source cell 32, the position of a flux monitor, or the temperature of the substrate, in each MBE epitaxy apparatus. The region of the above-mentioned ratio (0.91 or more and 1.39 or less, 0.92 or more and 1.35 or less, or 0.95 or more and 1.20 or less) by the particle beam intensity P (Torr) means the region that the deposition rate of ZnSe is saturated with the ratio of the particle beams of selenium to zinc shown in FIG. 11, or that c(2×2) and (2×1) ZnSe rearranged structures, which are observed by RHEED, are simultaneously present.

Next, a second Group II–VI buffer layer 3B of 200 nm thickness and composed of n-ZnSSe containing chlorine as a n-type impurity is deposited on the first Group II–VI buffer layer 3A, and a first clad layer 4 of 1 μm thickness and composed of a n-ZnMgSSe mixed crystal containing chlorine as a n-type impurity is deposited thereon. The ZnMgSSe mixed crystal has a composition of, for example, 88 mole % of zinc and 12 mole % of magnesium in the Group II elements, and 16 mole % of sulfur and 84% of selenium in the Group VI elements such that the lattice constant of the mixed crystal is equal to that of GaAs as the constituent of the substrate 1.

On the first clad layer 4, a first guide layer 5 of 100 nm thickness and composed of, for example, a ZnSSe mixed crystal is deposited. The ZnSSe mixed crystal has a composition of, for example, 6 mole % of sulfur and 94 mole % of selenium in the Group VI elements. An active layer 6 of 6 nm thickness, composed of, for example, a ZnCdSe mixed crystal, and having a single quantum well structure is deposited on the first guide layer 5. The ZnCdSe mixed crystal has a composition of, for example, 80 mole % of zinc and 20 mole % of cadmium in the Group II elements. A second guide layer 7 of 100 nm thickness and composed of the ZnSSe mixed crystal as in the first guide layer 5 is deposited on the active layer 6, and then a second clad layer 8 composed of a p-ZnMgSSe mixed crystal containing nitrogen as a p-type impurity is deposited thereon. Next, a first semiconductor layer 9 of 1 μm thickness and composed of a p-ZnSSe mixed crystal containing nitrogen as a p-type impurity is deposited on the second clad layer 8, a second semiconductor layer 10 of 100 nm thickness and composed of p-ZnSe containing nitrogen as a p-type impurity is deposited thereon, and a superlattice semiconductor layer 11 composed of nitrogen doped p-ZnTe and nitrogen doped p-ZnSe and a contact layer 12 composed of nitrogen doped p-ZnTe are deposited in that order.

A photoresist is applied onto the contact layer 12, a stripe mask pattern not shown in the drawing is formed by photolithography, the contact layer 12 and the superlattice semiconductor layer 11 are selectively removed to form a stripe pattern by wet etching or dry etching using the mask pattern as a mask. An insulating layer is vapor-deposited on the semiconductor layer 10 which is exposed by the selective etching of the contact layer 12 and the superlattice semiconductor layer 11, and the mask pattern is removed together with the insulating layer thereon to form a (lift-off) insulating layer 13.

Palladium, platinum and gold are separately deposited on the insulating layer 13 and the contact layer 12 to form a p-type electrode 14. Indium is deposited on the back face of the substrate 1 to form a n-type electrode 15. The luminescent semiconductor device having the configuration as shown in FIG. 1 is fabricated in such a manner.

In the method for making the luminescent semiconductor device in accordance with the present invention, the particle beam of zinc as the Group II element with a dose of at least $8 \times 10^{-4}$ Torr·sec or at least $3.5 \times 10^{17}$ cm$^2$ is radiated, and thus the density of the stacking fault in the Group II–VI compound semiconductor is decreased to $5 \times 10^3$ cm$^{-2}$ or less. The propagation of the non-luminescent recombination centers in the active layer 6 is therefore reduced when a current flows. Accordingly, a high luminescent efficiency is maintained for a long term, resulting in a prolonged life of the device.

In addition, before depositing the Group II–VI compound semiconductor layer, the surface of the Group III–V buffer layer 2 is rearranged to a stabilized (2×4) arsenic surface observed by RHEED, and then the particle beam of zinc is radiated. As a result, the stacking fault density can be further reduced in the Group II–VI compound semiconductor layer.

Further, before depositing the Group II–VI compound semiconductor layer, the surface of the Group III–V buffer layer 2 is rearranged to a stabilized (2×4) arsenic surface observed by RHEED, and then the particle beam of zinc is radiated for the multiplet structure in the <110> direction observed by RHEED to change from a quadruplet pattern (4×) to a singlet pattern (1×). Thus, the stacking fault density can also be further reduced in the Group II–VI compound semiconductor layer.

Since the particle beam of zinc is radiated in a dose which is at least 1.5 times the dose applied for the multiplet structure in the <110> direction on the surface observed by RHEED to change from a quadruplet pattern (4×) to a singlet pattern (1×), the stacking fault density in the Group II–VI compound semiconductor layer is decreased to $5 \times 10^3$ cm$^{-2}$ or less.

Since the Group III–V buffer layer 2 composed of GaAs is deposited on the GaAs substrate 1 by a MBE process, the surface of the substrate 1 is planarized and the stacking fault density in the Group II–VI compound semiconductor layer can be further reduced.

A particle beam composed of zinc and a particle beam composed of selenium are alternately radiated each at least one time, or a particle beam of selenium is intermittently radiated at least one time while radiating the particle beam of zinc, on at least a portion, adjoining the Group III–V buffer layer 2, of the Group II–VI buffer layer 3A. The interface between the Group III–V buffer layer 2 and the first Group II–VI buffer layer 3A is further planarized, and thus the stacking fault density in the Group II–VI semiconductor layer can be further reduced.

Since, the first Group II–VI buffer layer 3A is deposited with the ratio by intensity of the particle beam of selenium to the dose of the particle beam of zinc is 0.91 or more and 1.39 or less, and the ratio of the particle beams reaching the depositing surface per unit time and unit area is 0.64 or more and 0.98 or less, the stacking fault density can be reduced to $5 \times 10^3$ cm$_{-2}$ or less.

The present invention is not limited to the above-mentioned embodiments, and can include various modifications. For example, both the substrate 1 and the Group III–V buffer layer 2 deposited thereon are composed of GaAs in the above-mentioned embodiments. The substrate and the Group III–V buffer layer may be composed of at least one Group III element selected from the group consisting of gallium, aluminum, boron and indium, and at least one Group V element selected from the group consisting of nitrogen, phosphorus, arsenic, antimony and bismuth. The compositions of the substrate and the buffer layer may be the same or different. When depositing a plurality of Group III–V buffer layers on the substrate, the Group III–V buffer layers generally have different compositions from the substrate.

When the Group III–V buffer layer is composed of GaInP, GaP or InP, the surface of the buffer layer may be modified into a (2×2) or (2×4) stabilized-phosphorus surface observed by RHEED before depositing the Group II–VI compound semiconductor layer to reduce the stacking fault density. Also, in this case, the stacking fault density can be reduced to $5 \times 10^3$ cm$^{-2}$ or less by controlling the dose of the particle beam composed of the Group II element to at least $8 \times 10^{-4}$ Torr·sec or at least $3.5 \times 10^{17}$ cm$^{-2}$ before depositing the Group II–VI compound semiconductor layer. The multiplet structure in the <110> direction according to RHEED observation is thereby changed from a doublet (2×) or quadruplet (4×) pattern to a singlet (1×) pattern. The dose of the particle beam of the Group II element may be at least 1.5 times the dose which is applied for the multiplet structure in the <110> direction on the surface observed by RHEED to change from a quadruplet pattern (4×) to a singlet pattern (1×).

In the above-mentioned embodiments, each of the Group II–VI compound semiconductor layers is not limited to the above-mentioned embodiments, and may be composed of at least one Group II element selected from the group consisting of zinc, magnesium, cadmium mercury and beryllium, and at least one Group VI element selected from the group consisting of oxygen, selenium, sulfur and tellurium.

Although the particle beam of zinc as the Group II element is radiated before the first Group II–VI buffer layer 3A is deposited in the above-mentioned embodiment, the particle beam may be composed of at least one Group II element selected from the group consisting of zinc, magnesium, cadmium, mercury and beryllium, in consideration of the composition of the first Group II–VI buffer layer 3A.

The particle beam composed of the Group II element and the particle beam composed of the Group VI element are alternately radiated on the group III–V buffer layer 2 to deposit a portion of the first Group II–VI buffer layer 3A in the above-mentioned embodiment. Also, the entire first Group II–VI buffer layer 3A may be deposited in such a manner. Other Group II–VI compound semiconductor layers also may be deposited by such a process. These substitute for the intermittent radiation of the particle beam composed of the Group VI element while radiating the particle beam composed of the Group II element.

Instead of the alternate or intermittent radiation in the above-mentioned embodiments, the particle beam of the Group II element and the particle beam of the Group VI element may be simultaneously radiated to deposit the Group II–VI buffer layer 3A on the Group III–V buffer layer 2.

In the above-mentioned embodiments, the first Group II–VI buffer layer 3A is deposited with a particle beam ratio of the Group VI element to the Group II element of 0.91 or more and 1.39 or less by particle beam intensity P (Torr), or 0.64 or more and 0.98 or less by number f $(cm^{-2} \cdot sec^{-1})$ of particles reaching the deposited surface per unit time and unit area. Alternatively, a portion, adjoining the Group III–V buffer layer 2, of the first Group II–VI buffer layer may be deposited in such a manner. Other Group II–VI compound semiconductor layers may also be deposited by such a process.

In the above-mentioned embodiments, a luminescent semiconductor device is described as an example of the semiconductor devices. The method in accordance with the present invention is also applicable to other types of luminescent compound semiconductor devices, for example, luminescent semiconductor devices not having guide layers, and various semiconductor devices, for example, high-speed dynamic devices.

Although the group III–V compound semiconductor layer and the Group II–VI compound semiconductor layer are deposited by a MBE process in the above-mentioned embodiment, other particle-beam radiation processes, for example, a gas-source MBE process is also applicable to the method in accordance with the present invention.

What is claimed is:

1. A method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing said Group II–VI compound semiconductor layer, a particle beam composed of at least one Group II element selected from the group consisting of zinc, magnesium, beryllium, cadmium and mercury is radiated onto the surface of said Group III–V compound semiconductor layer for a multiplet structure in the<110>direction on said surface observed by RHEED to change from a quadruplet pattern (4×) to a singlet pattern (1×).

2. A method for making a semiconductor device according to claim 1, wherein said Group III–V compound semiconductor layer comprises gallium and arsenic.

3. A method for making a semiconductor device according to claim 1, wherein before depositing said Group II–VI compound semiconductor layer, the dose of said particle beam composed of at least one Group II element is at least 1.5 times the dose which is applied for said multiplet structure in the<110>direction on said surface observed by RHEED to change from a quadruplet pattern (4×) to a singlet pattern (1×).

4. A method for making a semiconductor device according to claim 1, wherein said Group III–V compound semiconductor layer is deposited onto a Group III–V compound semiconductor substrate comprising at least one Group III element selected from the group consisting of gallium, aluminum, boron and indium and at least one Group V element selected from the group consisting of nitrogen, phosphorus, arsenic, antimony and bismuth.

5. A method for making a semiconductor device according to claim 1, wherein said Group III–V compound semiconductor layer has a thickness of 10 nm or more.

6. A method for making a semiconductor device according to claim 1, wherein a particle beam composed of at least one Group II element selected from the group consisting of zinc, magnesium, manganese, beryllium, cadmium and mercury and a particle beam composed of at least one Group VI element selected from the group consisting of oxygen, sulfur, selenium and tellurium are alternately radiated each at least one time, so as to deposit at least a portion, adjoining said Group III–V compound semiconductor layer, of said Group II–VI compound semiconductor layer.

7. A method for making a semiconductor device according to claim 1, wherein a particle beam composed of at least one Group VI element selected from the group consisting of oxygen, sulfur, selenium and tellurium is intermittently radiated at least one time while radiating a particle beam composed of at least one Group II element selected from the group consisting of zinc, magnesium, manganese, beryllium, cadmium and mercury, so as to deposit at least a portion, adjoining said Group III–V compound semiconductor layer, of said Group II–VI compound semiconductor layer.

8. A method for making a semiconductor device according to claim 1, wherein the ratio by intensity of the dose of said particle beam composed of said Group II element to the dose of said particle beam composed of said Group VI element is 0.91 or more and 1.39 or less, and the ratio of the particle beams reaching the deposited surface is 0.64 or more and 0.98 or less, so as to deposit at least a portion, adjoining said Group III–V compound semiconductor layer, of said Group II–VI compound semiconductor layer.

9. A method for making a semiconductor device according to claim 1, wherein the surface of said III–V compound semiconductor is rearranged to a (2×4) stabilized-arsenic surface observed by RHEED by adjusting the temperature.

10. A method for making a semiconductor device comprising: depositing at least one Group II–VI compound semiconductor layer comprising at least one Group II element selected from the group consisting of zinc, magnesium, manganese, beryllium, cadmium and mercury and at least one Group VI element selected from the group consisting of oxygen, sulfur, selenium and tellurium onto a Group III–V compound semiconductor layer comprising at least one Group III element selected from the group consisting of gallium, aluminum, boron and indium and at least one Group V element selected from the group consisting of nitrogen, phosphorus, arsenic, antimony and bismuth; wherein before depositing said Group II–VI compound semiconductor layer, the surface of said III–V compound semiconductor is rearranged to a (2×2) stabilized-phosphorus surface or a (2×4) stabilized-phosphorus surface observed by RHEED, and then a particle beam composed of at least one Group II element selected from the group consisting of zinc, magnesium, beryllium, cadmium and mercury is radiated onto the surface of said Group III–V compound semiconductor layer for a multiplet structure in the<110>direction on said surface observed by RHEED to change from a doublet pattern (2×) or a quadruplet pattern (4×) to a singlet pattern (1×).

11. A method for making a semiconductor device according to claim 10, wherein said Group III–V compound semiconductor layer comprises indium and phosphorus.

12. A method for making a semiconductor device according to claim 10, wherein said Group III–V compound semiconductor layer comprises gallium and arsenic.

13. A method for making a semiconductor device according to claim 10, wherein before depositing said Group II–VI compound semiconductor layer, the dose of said particle beam composed of at least one Group II element is at least 1.5 times the dose which is applied for said multiplet structure in the<110>direction on said surface observed by RHEED to change from a quadruplet pattern (4×) to a singlet pattern (1×).

14. A method for making a semiconductor device according to claim 10, wherein said Group III–V compound semiconductor layer is deposited onto a Group III–V compound semiconductor substrate comprising at least one Group III element selected from the group consisting of gallium, aluminum, boron and indium and at least one Group V element selected from the group consisting of nitrogen, phosphorus, arsenic, antimony and bismuth.

15. A method for making a semiconductor device according to claim 10, wherein said Group III–V compound semiconductor layer has a thickness of 10 nm or more.

16. A method for making a semiconductor device according to claim 10, wherein a particle beam composed of at least one Group II element selected from the group consisting of zinc, magnesium, manganese, beryllium, cadmium and mercury and a particle beam composed of at least one Group VI element selected from the group consisting of oxygen, sulfur, selenium and tellurium are alternately radiated each at least one time, so as to deposit at least a portion, adjoining said Group III–V compound semiconductor layer, of said Group II–VI compound semiconductor layer.

17. A method for making a semiconductor device according to claim 10, wherein a particle beam composed of at least one Group VI element selected from the group consisting of oxygen, sulfur, selenium and tellurium is intermittently radiated at least one time while radiating a particle beam composed of at least one Group II element selected from the group consisting of zinc, magnesium, manganese, beryllium, cadmium and mercury, so as to deposit at least a portion, adjoining said Group III–V compound semiconductor layer, of said Group II–VI compound semiconductor layer.

18. A method for making a semiconductor device according to claim 10, wherein the ratio by intensity of the dose of said particle beam composed of said Group II element to the dose of said particle beam composed of said Group VI element is 0.91 or more and 1.39 or less, and the ratio of the particle beams reaching the deposited surface is 0.64 or more and 0.98 or less, so as to deposit at least a portion, adjoining said Group III–V compound semiconductor layer, of said Group II–VI compound semiconductor layer.

19. A method for making a semiconductor device according to claim 10, wherein the surface of said III–V compound semiconductor is rearranged to a (2×2) stabilized-phosphorus surface or a (2×4) stabilized-phosphorus surface observed by RHEED by adjusting the temperature.

* * * * *